(12) United States Patent　(10) Patent No.: US 7,885,134 B2
Li et al.　(45) Date of Patent: Feb. 8, 2011

(54) REFRESH CONTROLLER AND REFRESH CONTROLLING METHOD FOR EMBEDDED DRAM

(75) Inventors: Yu Fei Li, Shanghai (CN); Yong Lu, Shanghai (CN); Yang Hao, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 12/507,224

(22) Filed: Jul. 22, 2009

(65) Prior Publication Data

US 2010/0027363 A1　Feb. 4, 2010

(30) Foreign Application Priority Data

Jul. 29, 2008　(CN) .......................... 2008 1 0128078

(51) Int. Cl.
*G11C 7/00*　(2006.01)
(52) U.S. Cl. ............. 365/222; 365/185.11; 365/230.03; 365/185.25
(58) Field of Classification Search ............ 365/185.11, 365/230.03, 185.25, 222
See application file for complete search history.

(56) References Cited

U.S. PATENT DOCUMENTS

2008/0270683 A1 * 10/2008 Barth et al. ................. 711/105

* cited by examiner

*Primary Examiner*—Huan Hoang
*Assistant Examiner*—Jason Lappas
(74) *Attorney, Agent, or Firm*—Robert R. Williams (57) ABSTRACT

The present invention provides a refresh controller for embedded DRAM, configured to receive an external access signal and generate refresh enabling signal REFN, refresh address signal CRA and confliction signal, said embedded DRAM comprising a plurality of memory groups, said controller comprising: a status controlling module that generates refresh enabling signal REFN and last refresh signal last_ccr according to the refresh interval and clock cycles; a refresh searching module that searches in said plurality of memory bank groups for at least one memory bank group that is to be refreshed in the refresh interval, and generates refresh address signal CRA according to the external access signal and the searched memory bank group; a scoreboard module that records the status of each of said plurality of memory bank groups according to said refresh address signal CRA and external access signal; and a confliction detecting module that generates confliction signal according to said external access signal, last refresh signal last_ccr and the status of each of said memory banks. A corresponding refresh controlling method is also provided in the present invention.

20 Claims, 7 Drawing Sheets

REFRESH CONTROLLER AND REFRESH CONTROLLING METHOD FOR EMBEDDED DRAM

FIELD OF THE INVENTION

The present invention relates to DRAM refresh controlling, specifically, to refresh controller and refresh controlling method for embedded DRAM.

BACKGROUND OF THE INVENTION

Compared to traditional external dynamic random access memory (DRAM), the embedded DRAM (eDRAM) can work for larger band width with lower power consumption and less chip pins. In the 65 nm generation technology, the frequency performance of the embedded DRAM already exceeds 500 MHz. However, like traditional DRAM, in order to retain the data saved in embedded DRAM, periodical refreshing must be performed to each of the memory elements. The delay of the refreshing structure might limit further development of the system performance of embedded DRAM.

The concurrent refresh (CCR) mode of embedded DRAM allows concurrent implementation of refresh operation and read/write operation. However, in the CCR refresh operation, the target memory bank of the embedded DRAM must be different from the memory bank under current read/write operation, i.e., refresh operation and read/write operation can not be performed to the same memory bank at the same time. There are a plurality of refresh modes for the CCR refresh of embedded DRAM. Single-CCR refers to refreshing only one bank in a refresh cycle, and dual-CCR means refreshing two banks in a refresh cycle. Similarly, quad-CCR means refreshing four banks in each cycle. Moreover, each refresh operation of embedded DRAM can be performed in multiple clock cycles in order to support higher work frequency. Besides the one-stage pipeline operation in which each operation is performed in one clock cycle, the embedded DRAM can also support multiple-stage pipeline operation modes. For two-stage pipeline operation, each of the refresh, read and write operations is completed in two clock cycles; for four-stage pipeline operation, each operation is completed in four clock cycles.

In order to support CCR refresh in various modes, various refresh methods have been provided in the prior art. For example, U.S. Pat. No. 6,195,303 provides a refresh mechanism for DRAM based on clock. However, said mechanism can not be applied to embedded DRAM. A scheduler circuit for avoiding memory conflection in concurrent requests has been provided in U.S. Pat. No. 6,393,534. However, the scheduler circuit can only be applied in RDRAM, not embedded DRAM. And it is too complicated for implementation and synthesis. U.S. Pat. No. 6,967,885 provides an embedded DRAM supporting concurrent refresh mode with distributed row address counters In the 65 nm generation technology, said refresh mode can achieve 1 GHz frequency. The technique of said patent is implemented by adding row address counters inside the embedded DRAM and is a modification to embedded DRAM itself. On the basis of this patent, the present invention controls CCR refresh by adding a refresh controller outside the embedded DRAM.

SUMMARY OF THE INVENTION

The aim of the present invention is to provide a flexible refresh controller for embedded DRAM to control the refreshing in various refresh modes, and to eliminate or avoid conflictions of memory banks.

For this purpose, according to the first aspect of the present invention, a refresh controller is provided for embedded DRAM, configured to receive an external access signal, generate a refresh enabling signal REFN, a refresh address signal CRA and a confliction signal, and transmit the refresh enabling signal REFN and refresh address signal CRA to said embedded DRAM which contains a plurality of memory groups, said controller comprising: a status controlling module, configured to generate said refresh enabling signal REFN and said last refresh signal last_ccr according to the refresh interval and clock cycles; a refresh searching module, configured to search in said plurality of memory bank groups for at least one memory bank group that is to be refreshed in the refresh interval, and generate said refresh address signal CRA according to said external access signal and the searched memory bank group; a scoreboard module, configured to record the status of each of said plurality of memory bank groups according to said refresh address signal CRA and external access signal; a confliction detecting module, configured to generate confliction signal according to said external access signal, last refresh signal last_ccr and the status of each of said memory banks.

According to the second aspect of the present invention, a refresh controlling method is provided for embedded DRAM, said embedded DRAM comprising a plurality of memory bank groups, said method comprising: receiving an external access signal; generating a refresh enabling signal REFN and a last refresh signal last_ccr according to the clock cycles in each refresh interval; searching in said plurality of memory bank groups for at least one memory bank group to be refreshed in the refresh interval, and generating a refresh address signal CRA according to the external access signal and searched memory bank group; recording the status of each of said plurality of memory bank groups according to said refresh address signal CRA and external access signal; generating a confliction signal according to said external access signal, last refresh signal last_ccr and the status of each of said memory banks; and transmitting the refresh enabling signal REFN and refresh address signal CRA to said embedded DRAM.

The refresh controller and the controlling method according to the present invention are applicable to various combinations of single-CCR, dual-CCR, quad-CCR and different pipeline operations with high flexibility and configurability. For each refresh mode, the controller and controlling method according to the present invention are capable of simple and efficient refresh controlling, avoiding conflictions due to access and refreshing.

DESCRIPTION OF THE DRAWINGS

Embodiments of the present invention are described below in combination with the drawings, in which.

DESCRIPTION OF THE EMBODIMENTS

With reference to the drawings, the implementation of the present invention is described below in combination with specific embodiments.

Figure 1:
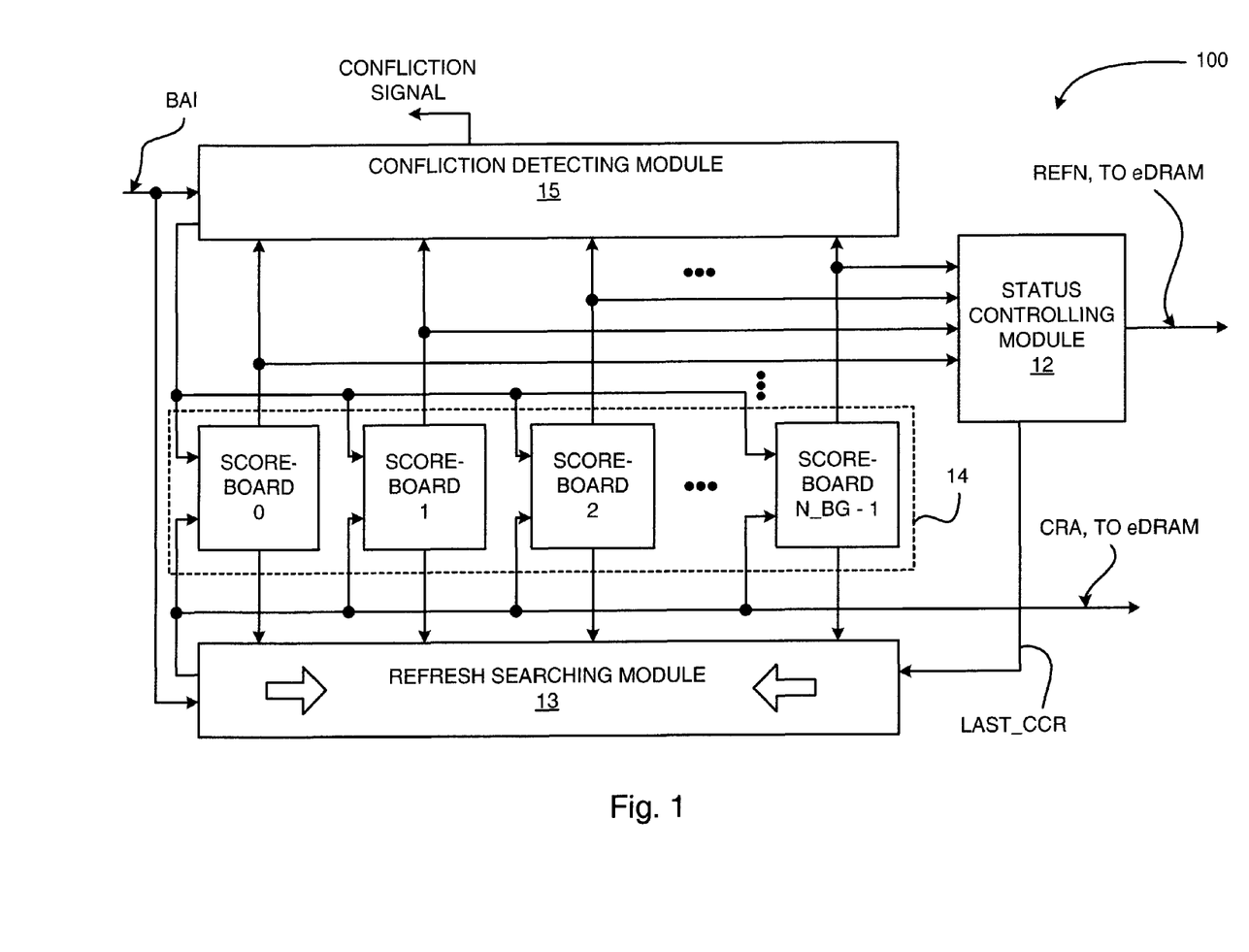
FIG. 1 illustrates the system structure of the refresh controller according to an embodiment of the present invention.

FIG. 1 illustrates the system structure of a refresh controller according to an embodiment of the present invention. The refresh controller of FIG. 1 is indicated by number 100 generally. The controller 100, connected with embedded DRAM, is configured to receive a read/write signal directing memory bank bai from outside, and generate refresh enabling signal REFN, CCR refresh address signal CRA and confliction signal, wherein the generated refresh enabling signal REFN and CCR refresh address signal CRA are transmitted to embedded DRAM and employed to realize the refresh controlling of the embedded DRAM. The confliction signal is sent back to the part initiates the read/write request to inform the occurring of a confliction. Said embedded DRAM comprises a plurality of memory banks, which are divided into a plurality of memory bank groups according to different configuration and refresh modes of the embedded DRAM. For example, for single-CCR mode, each memory bank group corresponds to one memory bank; for dual-CCR mode, since two memory banks are to be refreshed in each refresh cycle, each memory bank group includes two memory banks; for quad-CCR mode, each memory bank group includes four memory banks.

More specifically, the external access signal bai can be a read request signal or a write request signal, and it indicates the address of the memory bank to be accessed. The refresh enabling signal REFN has two statuses, indicating respectively whether the embedded DRAM is currently in refresh status or not. The CCR refresh address signal CRA indicates the address of the memory bank group to be refreshed. Combining the REFN signal and the CRA signal, information can be indicated on whether the embedded DRAM is being refreshed and which memory bank group is to be refreshed.

In order to generate and process the above signals, as shown in the figure, the controller 100 comprises a status controlling module 12, a refresh searching module 13, a scoreboard module 14 and a confliction detecting module 15.

The status controlling module 12 is provided to monitor the refresh interval and clock cycle and accordingly generate the refresh enabling signal REFN and the last refresh signal last_ccr. The refresh searching module 13 is provided to search in a plurality of memory bank groups for the memory bank group to be refreshed, and generate the CCR refresh address signal CRA according to the external access signal bai and the searched memory bank group. The scoreboard module 14 is provided to record the status of each memory bank group according to the CCR refresh address signal CRA and the external access signal bai. The confliction detecting module 15 is provided to generate the confliction signal according to the external access signal bai, the last refresh signal last_ccr and the status of each memory bank.

The work flow of each module in the controller 100 is described below in combination with specific examples of refresh operations.

In one example, it is assumed that for Cu65 type embedded DRAM under 65 nm technology, the data retaining time of each memory cell is tREF=40,960 ns. The clock cycle of the system is tCK=3 ns. The number of memory banks in said embedded DRAM is N_BANKS=8, thus in single-CCR mode, the number of memory bank groups N_BG is also 8, and the number of rows in each memory bank is M=256. In order to guarantee that data in each memory cell would never be lost, each row in each memory bank must be refreshed at least once within the retaining time tREF, i.e. for each memory bank, the average interval between two consecutive refresh operations should not be more than tREF/tCK/M clock cycles. However, since the refresh operation of memory banks doesn't always occur in the same sequence, there is a possibility that a certain memory bank is the first to be refreshed in one refresh interval, and is also the last to be refreshed in the next refresh interval. In order to ensure that the memory banks can be refreshed in time even under the above worst condition, the refresh interval can be set to be tREF/tCK/M-N_BG clock cycles. That is, in the example above, the refresh interval is set to be N_RFC=tREF/tCK/M-N_BG=45 clock cycles. Those skilled in the art can understand that this is not the only way to set the refresh interval, and shorter refresh intervals can also be applied in order to ensure timely refresh of memory cells.

Figure 2:
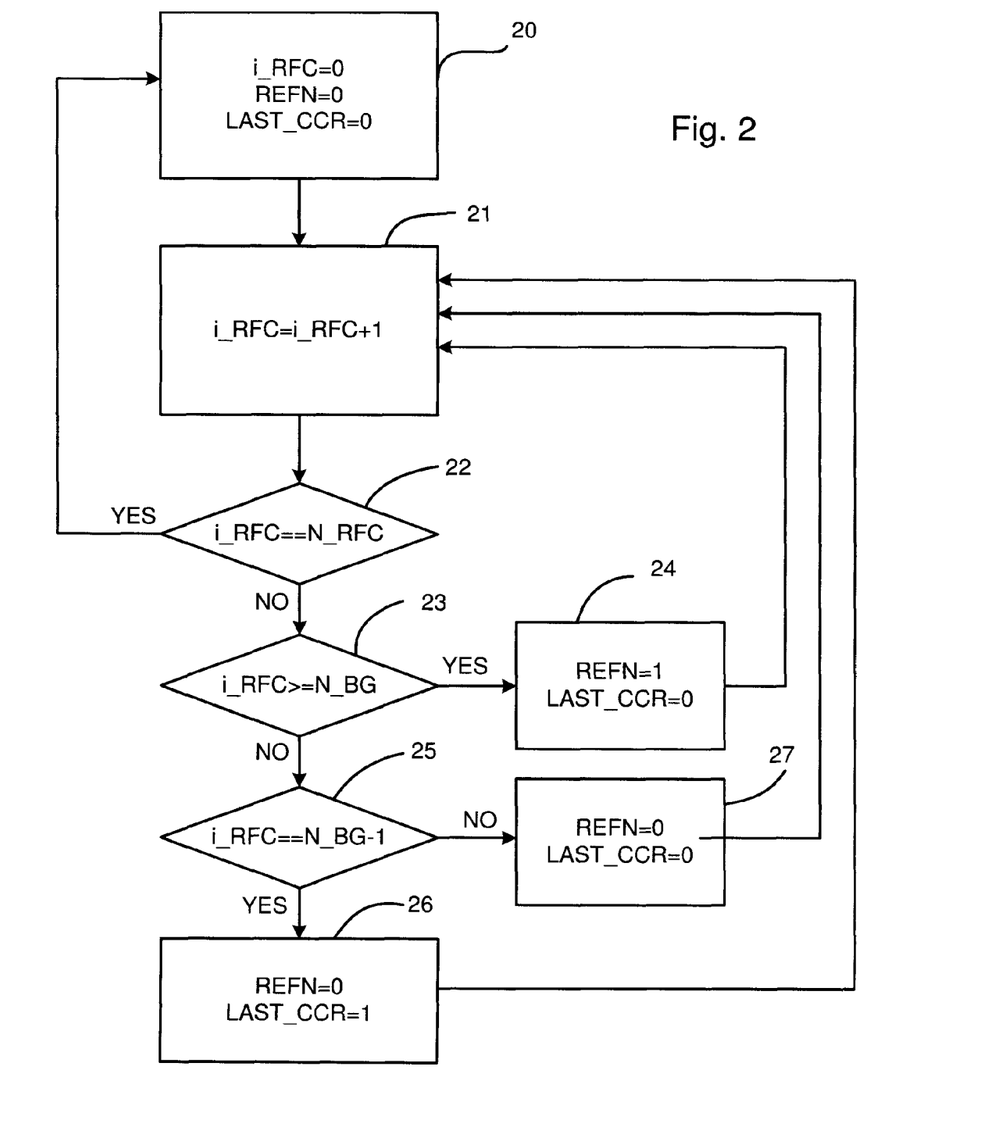
FIG. 2 illustrates the work flow of the status controlling module 12.

Now with reference to FIG. 2, assuming a refresh interval of N_RFC, the work flow of the status controlling module 12 is described. Generally, the status controlling module 12 generates the refresh enabling signal REFN and last refresh signal last_ccr based on the clock sequence in such a way that the embedded DRAM is indicated to start the refreshing of the memory bank groups at the beginning of each refresh interval, and specifically to start the refreshing of a new memory bank group at the beginning of each clock cycle, in order to ensure the completion of refresh operations as soon as possible. There are two status of the REFN signal, the first status and the second status. Here the first status of REFN (0) is assumed to indicate that the embedded DRAM is currently under the status of being refreshed, and the second status of REFN (1) is assumed to indicate that the embedded DRAM is not under refreshing. There are also two status of the last_ccr signal, wherein the first status of last_ccr (0) is assumed to indicate that there are more than one memory bank group to be refreshed; and the second status of last_ccr (1) is assumed to indicate that there are only one memory bank group left to be refreshed in the current refresh cycle. Specifically, whether the first status and the second status are indicated by 0 or 1 is related to the particular circuit implementation. The below content of the description is based on the above assumptions.

As shown in FIG. 2, first in step 20, signal REFN and last_ccr are both set as in the first status. This is the initial setting at the beginning of a new refresh interval, for when a new refresh interval begins, the refreshing of memory banks should be started, and there are currently more than one memory banks to be refreshed. Besides, in step 20, a counter i_RFC is provided to count the clock cycles. i_RFC is also set to be 0 in step 20, indicating a new refresh interval.

Then in step 21, along with the increase of the clock cycles, i_RFC increases by 1.

Then in step 22, a comparison between i_RFC and the clock number in one refresh interval N_RFC is carried out. An equal result means the end to the current refresh interval, and the next new refresh interval continues back from step 20. An unequal result means that the current refresh interval is not finished and the process proceeds to step 23.

In step 23, the relation between i_RFC and the number of memory bank groups N_BG in embedded DRAM is judged, wherein for single_CCR the number of memory bank groups N_BG is equal with the number of memory banks N_BANKS; for dual_CCR each memory bank group contains two memory banks, and N_BG=N_BANKS/2; for quad_CCR, N_BG=N_BANK/4. Since the status controlling module 12 starts the refreshing of one memory bank group at the beginning of each clock cycle, if i_RFC is greater than or equal to N_BG, it can be concluded that all the memory banks have been refreshed, and new refresh is not required. Therefore REFN is set to the second status in step 24 and last_ccr remains in the first status. Then by going back to step 21, the clock counting continues until the end of the current refresh interval. If i_RFC is smaller than N_BG, the process proceeds to step 25.

In step 25, compare i_RFC and N_BG−1. An equal result means that the refreshing is not finished, and there is only one last memory bank group remaining to be refreshed. Therefore in step 26 last_ccr is set to the second status and REFN signal remains in the first status. If the above two are not equal, then both REFN and last_ccr are set to the first status in step 27. Both step 26 and step 27 continue with step 21 for clock counting until the end of the current refresh interval.

According to the flow chart in FIG. 2, the status controlling module 12 generates the refresh enabling signal REFN and last refresh signal last_ccr based on the clock sequence, and transmits signal REFN to embedded DRAM and transmits signal last_ccr to the refresh searching module 13 and the confliction detecting module 14.

Figure 3:
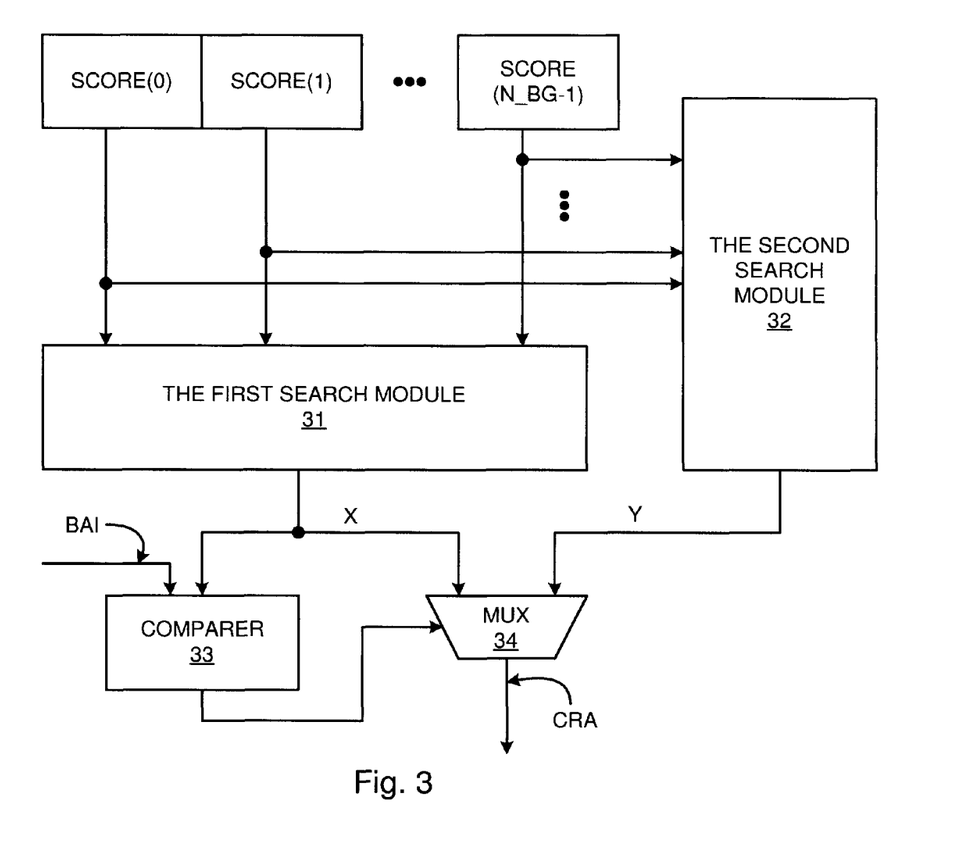
FIG. 3 illustrates an exemplary structure of the refresh searching module 13.

The refresh searching module 13 receives the external access signal bai and last refresh signal last_ccr, searches out memory bank groups to be refreshed base on the double search mode, and generates CCR refresh address signal CRA. FIG. 3 illustrates an exemplary structure of the refresh searching module 13.

As shown in FIG. 3, the refresh searching module 13 comprises a first search module 31, a second search module 32, a comparer 33 and a multiplexer MUX 34. In a specific embodiment, the first search module 31 is a forward search module, and the second search module 32 is a backward search module. Both of them are linked to the scoreboard module 15 and they search out the memory bank groups X and Y forwardly and backwardly respectively, i.e. they carry out bi-directional search. If only one memory bank group remains to be refreshed, then X=Y.

Bi-directional search can be implemented in the following way. The N_BG memory bank groups are indicated as 0, 1, ..., N_BG−1. The sequence number of the memory bank group searched by the forward search module is initialized as X=0, and the sequence number of the memory bank group searched by the backward search module is initialized as Y=N_BG−1. In each clock cycle thereafter, it is found out which search module is the memory bank group that has been refreshed in the previous cycle chosen from. If it is chosen from the forward search module, then let X=X+1 and keep Y unchanged; if it is chosen from the backward search module, then let Y=Y−1 and keep X unchanged. Since X and Y always change (increase or decrease) along a fixed direction, the memory bank groups to be refreshed are searched sequentially from the two ends, thus guaranteeing that the memory bank groups are each refreshed only once in a refresh interval.

It can be understood that the first search module and the second search module can implement double search through other search algorithms, as long as the memory bank groups to be refreshed can be searched out sequentially. For example, the first search module searches memory bank groups with odd sequence numbers and the second search module searches memory bank groups with even sequence numbers. Or it can be implemented in the following way: the sequence number of the memory bank group searched by the first search module is initialized as X=1, and the sequence number of the memory bank group search by the second search module is initialized as Y=0. In each clock cycle that follows, let X=X+1 and find out which search module is the memory bank group that has been refreshed in the previous cycle chosen from. If it is chosen from the first search module, then keep Y unchanged; if it is chosen from the second search module, then let Y=X−1, i.e. let Y equals to the X in the previous cycle, that is, the memory bank group that has been missed in the refresh process. Those skilled in the art can employ different algorithms to implement such a double search process according to their need.

After the first search module 31 and the second search module 32 respectively search out the memory bank groups to be refreshed, X and Y, the two memory bank groups X and Y are sent to a multiplexer MUX 34, and meanwhile, memory bank group X is also transmitted to a comparer 33. Comparer 33 compares the external access signal bai and the memory bank group X, generates a compare signal, and outputs the compare signal to MUX 34 as the control signal thereof. Specifically, the comparer 33 judges whether the memory bank address indicated by signal bai belongs to memory bank group X. If the result is no, then it generates a compare signal of the first status, which controls the MUX 34 to choose X from X and Y as the output; if the memory bank address indicated by bai does belong to memory bank group X, then comparer 33 generates a compare signal of the second status, which controls the MUX to choose Y from X and Y as the output. The output signal from MUX 34 (X or Y) acts as the refresh address signal CRA indicating the memory bank group to be refreshed in the next clock cycle. This refresh address signal CRA is output to embedded DRAM in order to instruct it to refresh the indicated memory bank group. Meanwhile, this signal is also transmitted to the scoreboard module 14 and the confliction detecting module 15.

The scoreboard module is provided to record the status of each memory bank group. In one embodiment, the scoreboard module 14 comprises scoreboard 0, scoreboard 1, ..., and scoreboard N_BG−1, i.e. each scoreboard corresponds to a memory bank group to record the status of the memory bank group. In one example, each scoreboard is implemented by a counter. When the count is 0, it is indicated the corresponding memory bank group X is in free status; when the count is not 0, the corresponding memory bank group is performing certain operation.

Figure 4:
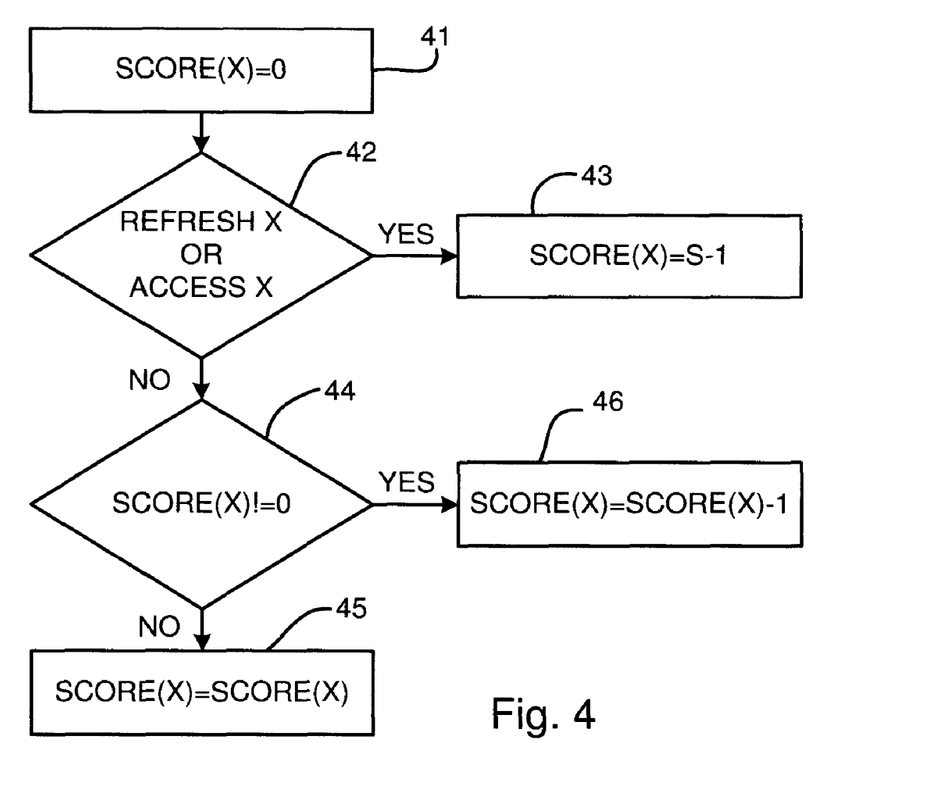
FIG. 4 illustrates the work flow of any score board X in the score board module 14.

FIG. 4 illustrates the work flow of an arbitrary scoreboard X in the scoreboard module 14. First, in step 41, the count of scoreboard X, score[X], is set to be 0 at the beginning of the refresh interval. Then in step 42, it is judged if the memory bank group X is to be refreshed or to be accessed. This judging step can be executed by comparing the memory bank group X with the external access signal bai and the CCR refresh address signal CRA. If the address indicated by bai belongs to the memory bank group X, then the group X is to be accessed. If the address indicated by CRA is memory bank group X, then X is to be refreshed.

After such a comparison, if the result indicates that the memory bank group X is to be refreshed or accessed, then execute step 43, and set the count of scoreboard X score[X] to be S−1, wherein S is the number of pipeline stage level. That is to say, for two-stage pipeline operation, S=2, and score[X] is set to be 1 at step 43; for four-stage pipeline operation, S=4, and score[X] is set to be 3. Then the process proceeds by going back to step 42, and judging for the next clock cycle.

If the judge result in step 42 indicates that the memory bank group X is not to be refreshed or accessed in the next clock cycle, then the process advances to step 44 to judge if score [X] is 0. If score[X] is 0, then execute step 45, keep the present value of score[X] and go back to step 42 to continue the judging for the next clock cycle. If score[X] is not 0, then decrease score[X] by 1 in step 46, i.e. score[X]=score[X]−1.

Then the process goes back to step 42 and continues the judging for the next clock cycle.

The above work flow means that for a memory bank group to be refreshed or to be accessed, the corresponding scoreboard count is set to be S−1, and for the scoreboard count that is currently not 0, its value is decreased by 1 in each clock cycle. That is because, for a S-stage pipeline operation, each operation is to be completed in S clock cycles. When a certain memory bank group begins an operation, setting the corresponding scoreboard count to be S−1 indicates that the corresponding memory bank group enters into the operation status. After that, each scoreboard count that is not 0 is decreased by 1 in each cycle. This ensures that from entering into the operation status (score[X]=S−1), each memory bank group has to go through S clock cycles before it returns to idle status (score[X]=0). In said S clock cycles, the corresponding memory bank group is kept under operation status. For one-stage pipeline operations, i.e. S=1, the scoreboard count is always 0, i.e. the scoreboard doesn't function for it.

Figure 5:
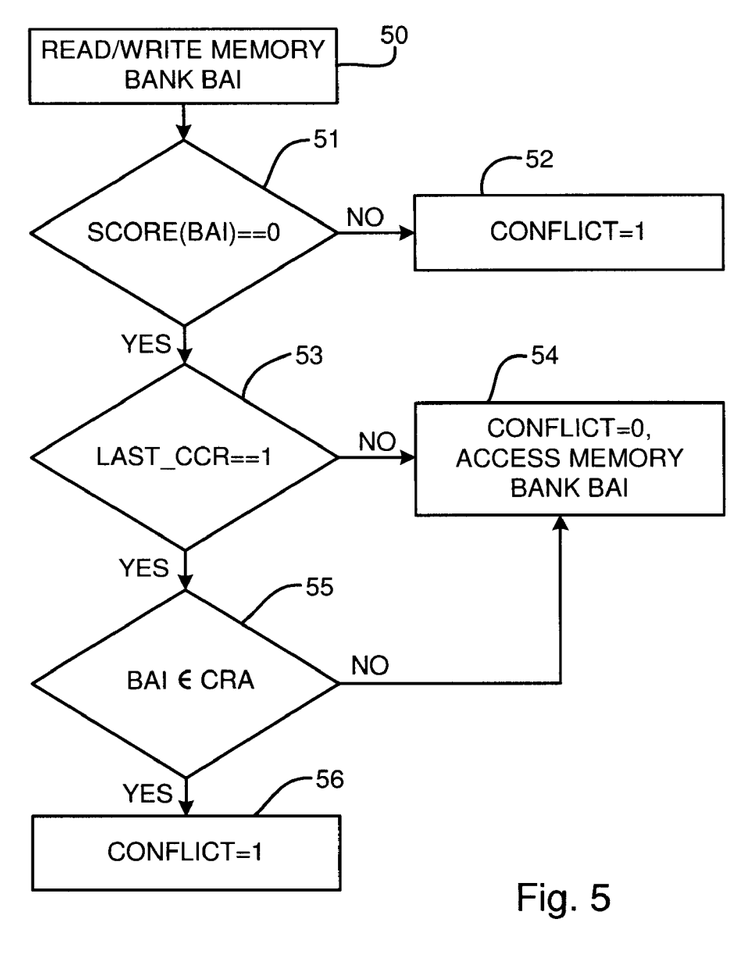
FIG. 5 illustrates the work flow of the confliction detecting module 15.

Based on the status of memory bank groups recorded by the scoreboard module 14 described above, the target memory bank bai of external access signal and the CCR refresh address signal CRA, the confliction detecting module 15 can detect whether a confliction occurs and generate a confliction signal. FIG. 5 illustrates the work flow of the confliction detecting module 15.

As shown in FIG. 5, first in step 50, the confliction detecting module 15 receives the external access signal, requesting a read/write operation to the memory bank bai. Then in step 51, judge whether the scoreboard count corresponding to memory bank bai is 0. Said count being 0 means the previous operation to the memory bank is not yet completed, thus the memory bank is under operation status and can not be accessed. Therefore step 52 is to be executed to generate a confliction signal, i.e. set conflict to be 1. If said count is 0, the memory bank is currently under idle status and is available to be accessed. Then further judging is to be carried out in step 53.

In step 53, judge whether last_ccr is in the second status. As described above, when last_ccr is in the first status, there are more than one memory bank group to be refreshed. In such a condition, it is always possible to find out a bank group that doesn't conflict with the access signal to be refreshed. Therefore if last_ccr is judged to be in the first status, execute step 54 and let conflict=0, i.e. no conflict is assumed and access to memory bank bai is approved. When last_ccr is in the second status, there is only one memory bank group to be refreshed in the current refresh interval. In such a condition, a confliction is possible to occur, and thus the process proceeds to step 55 for further judging.

In step 55, it is judged whether the memory bank to be accessed, bai, belongs to the memory bank group to be refreshed, i.e. the memory bank group indicated by signal CRA. If bai doesn't belong to said memory bank group, then no confliction occurs and step 54 is executed. If bai belongs to the memory bank group indicated by CRA, and meanwhile, since last_ccr is in the second status, meaning that the memory bank group is the only one to be refreshed, a confliction occurs between access and refresh. In such a condition, execute step 56, i.e. generate the confliction signal.

In one-stage pipeline operations, as described above, the count of each scoreboard is always 0. So, the judge result in step 51 is always "yes". In other words, in one-stage pipeline operations, since each operation is completed in one single clock cycle, a confliction caused by the memory bank to be accessed being in a previous operation won't occur. Consequently, for one-stage pipeline operations, step 51 and 52 can be omitted and the process can start directly from step 53 to start the judging.

In CCR refreshing, in order to retain the data in the memory cells, refresh operation has higher priority than access operations. Consequently, when a confliction signal is generated, i.e. when conflict=1, the confliction signal is sent back to the part initiates the access request, to inform said part to delay the access request until no confliction appears any more.

The work flow of the status controlling module 12, the refresh searching module 13, the scoreboard module 14 and the confliction detecting module 15 has respectively been described above. Now referring to FIG. 6, the refresh work flow of the refresh controller system is described.

Figure 6:
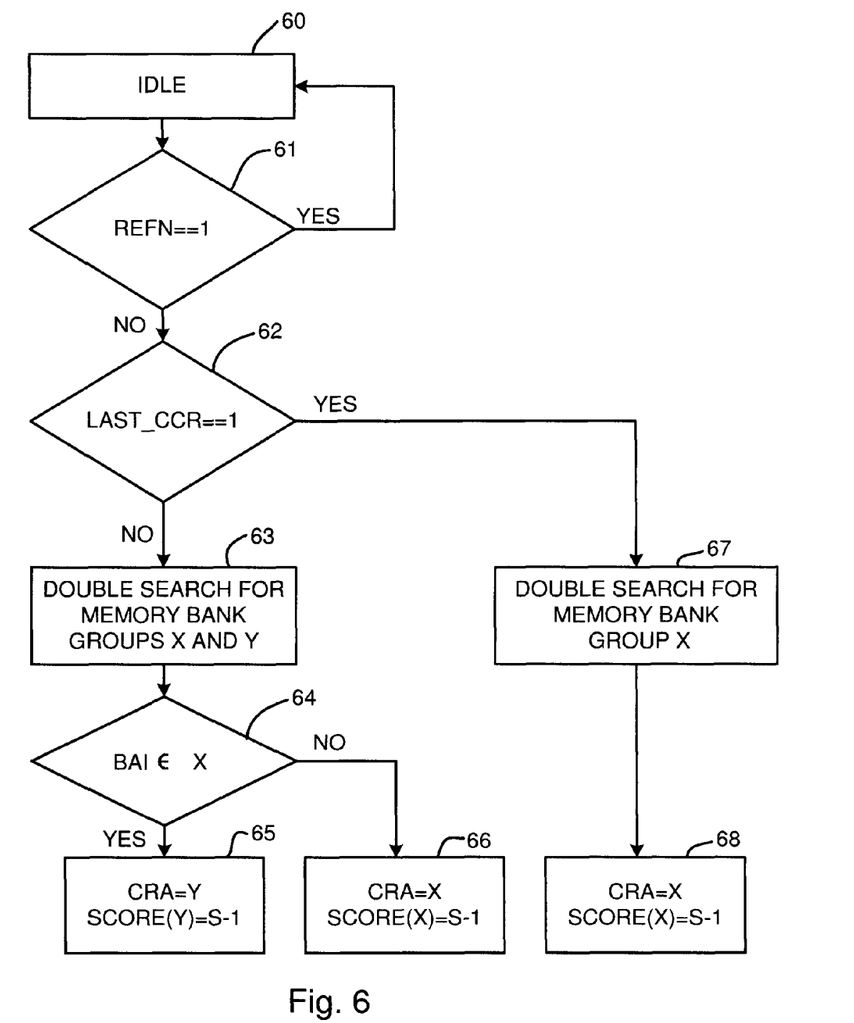
FIG. 6 illustrates the refresh work flow of the refresh controller in FIG. 1.

FIG. 6 illustrates the refresh work flow of the refresh controller in FIG. 1. As shown in FIG. 6, first in step 60, the refresh controller is in idle status. Then the step to be implemented is chosen according to the refresh enabling signal REFN and the last refresh signal last_ccr. As described above, signal REFN and last_ccr are both generated by status controlling module 12 with their specific generation process illustrated in FIG. 2. For the generated signal REFN, it is judged in step 61 whether REFN is in the second status. If REFN is the second status (1), it is indicated the embedded DRAM is not in refresh status. Therefore, the refresh controller doesn't have to implement refresh control on said embedded DRAM, and just need to return to step 60 to keep idle status. If REFN is in the first status (0), it is indicated the embedded DRAM is in refresh status, and the refresh controller must implement refresh control thereon. So, the controller goes to step 62 for further judging.

In step 62, the refresh controller judges whether the last refresh signal last_ccr is in the second status (1). If last_ccr is not in the second status, it means there are still a plurality of memory bank groups in the current refresh interval to be refreshed. Therefore, the controller advances to step 63 and searches out two memory bank groups X and Y to be refreshed using the double search mode. Then in step 64, it is judged whether the memory bank bai indicated by external access signal belongs to memory bank group X. If bai belongs to memory bank group X, then execute step 65, in which Y is set as the next memory bank group to be refreshed, i.e. CCR refresh address signal CRA is made to indicate memory bank group Y. Meanwhile, the count of the scoreboard corresponding to memory bank group Y, score[Y], is set to be S−1, wherein S is the number of pipeline stages. If bai doesn't belong to memory bank group X, then execute step 66, in which X is set as the next memory bank group to be refreshed, i.e. CCR refresh address signal CRA is made to indicate memory bank group X. Meanwhile, the count of the scoreboard corresponding to memory bank group X, score[X], is set to be S−1. Here the search and judging operations in steps 63 to 66 are executed by the refresh searching module 13. The meaning of setting scoreboard count to be S−1 can be understood with reference to the work flow of scoreboard in FIG. 4.

If the judging result in step 62 indicates that last_ccr is in the second status, it means there is only one memory bank group to be refreshed in the current refresh interval. In such a condition, the controller enters into step 67 and executes double search to search out the only memory bank group to be refreshed. Then in step 68, said memory bank group is set as the next memory bank group to be refreshed, i.e. CCR refresh address signal CRA is made to indicate said memory bank group. Meanwhile, the count of the scoreboard corresponding to said memory bank group is set to be S−1. Similarly, the search operation in step 67 and 68 are executed by the refresh searching module 13.

At the same time with the above work flow, the confliction detecting module 15 judges whether a confliction occurs according to the external access signal bai, the CCR refresh address signal CRA and the recorded status of scoreboard module, with the judging method illustrated in FIG. 5. When a confliction occurs, the confliction detecting module 15 informs the part initiates the access request in the form of confliction signal, so as to delay said access request until no confliction occurs any more. So, from the aspect of refresh flow, refresh can be carried out to the only memory bank group to be refreshed as soon as it is searched out in step 67. The sequence of refresh won't be influenced by the access confliction, since the confliction detecting module 15 has avoided such conflictions by delaying access requests.

Figure 7:
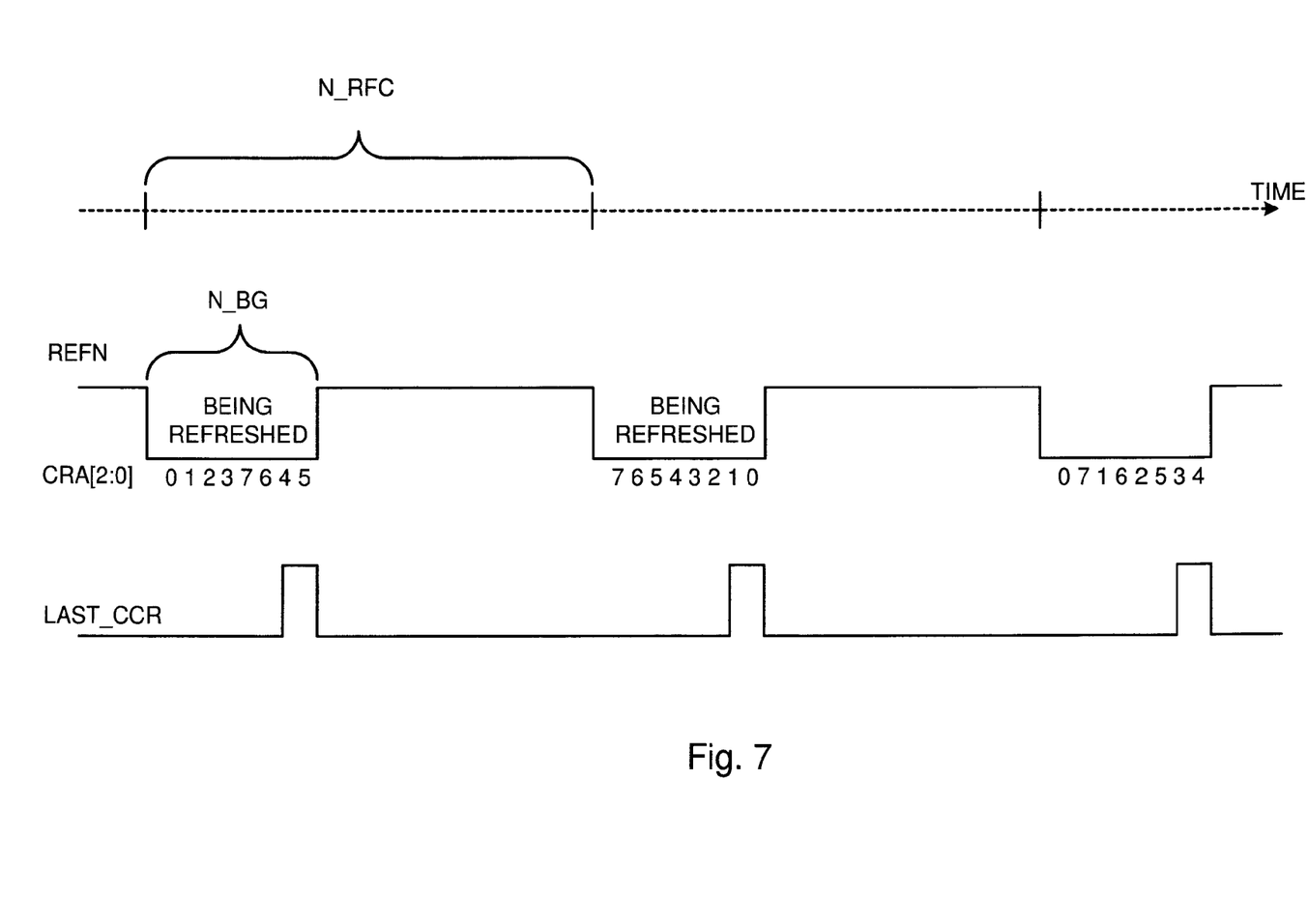
FIG. 7 illustrates the clock sequence diagram of the refresh flow in FIG. 6.

FIG. 7 illustrates the clock sequence diagram of the refresh flow. In FIG. 7 there can be seen the change of refresh enabling signal REFN, CCR refresh address signal CRA and last refresh signal last_ccr along with the clock.

Specifically, as illustrated in FIG. 7, the time is divided into a plurality of refresh intervals, each refresh interval containing N_RFC clock cycles. Through signals REFN and CRA, the refresh controller controls the embedded DRAM to start the refreshing of memory bank groups at the beginning of each refresh intervals and to complete the refresh operation as soon as possible. Consequently, from the clock cycle 0 to the clock cycle N_BG−1 in each refresh interval, the refreshing of a new memory bank group is started in each clock cycle. During this period, signal REFN is under low voltage, i.e. the REFN=0 (the first status), in order to indicate that the embedded DRAM is in refresh status.

During the period when REFN is under low voltage, the refresh searching module continuously searches out memory bank groups as the refresh address to be directed by signal CRA through bi-directional search. As a result, the number of the memory bank group directed by the CRA signal can be seen to change continuously until all the memory bank groups have been refreshed in the N_BG clock cycles. It can be seen that in the first refresh interval, the number 0 memory bank group is the first to be refreshed while in the second refresh interval the number 0 memory bank group is the last to be refreshed. That is the worst possible condition described above. Because of this condition, the number of clock cycles in one refresh interval has to be decreased by the number of memory bank groups on the original basis.

During the whole refresh interval, only in one clock cycle, i.e. the N_BG-th clock cycle, is the last refresh signal last_ccr in high voltage status, i.e. last_ccr=1 (the second status), which implies that in the present refresh interval, only one memory bank group remains to be refreshed.

It can be seen from the confliction detection flow that, only when last_ccr=1 (the second status) and the memory bank bai to be accessed belongs to the next memory bank group CRA to be refreshed does access and refresh conflictions appear. Further from the flow chart in FIG. 7, the probability of last_ccr=1 (the second status) is 1/N_RFC. It is thus concluded that if the memory banks in the embedded DRAM are accessed sequentially for each clock, the probability of access and refresh conflictions is 1/N_RFC at maximum.

In the embodiments described above, the refresh controller and its modules and elements are mainly implemented by integrated circuits or gate arrays, semiconductors such as transistors, or hardware circuits such as programmable gate arrays and programmable logic devices. And it can be understood that the refresh controller and methods of the present invention are applicable to various combinations of one-stage pipeline operations, two-stage pipeline operations, four-stage pipeline operations and the operation modes of single-CCR, dual-CCR, quad-CCR, with high flexibility and configurability.

Embodiments of the present invention are described above in combination with specific examples. However, the invention is not limited to the embodiments described in detail above. Those skilled in the art can understand that, various alternatives, variations and modifications can be made to the embodiments without deviating from the spirit and scope of the present invention; the protection scope is defined by the attached claims.

The invention claimed is:

1. A refresh controller for embedded DRAM, configured to receive an external access signal, generate a refresh enabling signal REFN, a refresh address signal CRA and a confliction signal, and transmit the refresh enabling signal REFN and the refresh address signal CRA to said embedded DRAM which contains a plurality of memory bank groups, said refresh controller comprising:
   a status controlling module, configured to generate said refresh enabling signal REFN and a last refresh signal last_ccr according to the refresh interval and clock cycles;
   a refresh searching module, configured to search in said plurality of memory bank groups for at least one memory bank group that is to be refreshed in the refresh interval, and to generate said refresh address signal CRA according to said external access signal and the searched memory bank group;
   a scoreboard module, configured to record the status of each of said plurality of memory bank groups according to said refresh address signal CRA and the external access signal; and
   a confliction detecting module, configured to generate the confliction signal according to said external access signal, last refresh signal last_ccr and the status of each of said memory banks.

2. The refresh controller according to claim 1, wherein said status controlling module is configured to count the clock cycles in each refresh interval, and, set said refresh enabling signal REFN as in its first status and set said last refresh signal last_ccr as in its first status when the counted number is smaller than the number of said memory bank groups minus one; to set said refresh enabling signal REFN as in its first status and set said last refresh signal last_ccr as in its second status when the counted number is equal to the number of said memory bank groups minus one; and to set said refresh enabling signal REFN as in its second status and set said last refresh signal last_ccr as in its first status when the counted number is equal to or larger than the number of said memory bank groups.

3. The refresh controller according to claim 2, wherein said refresh searching module comprises:
   a first search module, configured to search in said plurality of memory bank groups for the first memory bank group to be refreshed in the refresh interval;
   a second search module, configured to search in said plurality of memory bank groups for the second memory bank group to be refreshed in the refresh interval;
   a comparer, configured to compare the searched first memory bank group with the external access signal and generate a compare signal; and
   a multiplexer, configured to choose between the first memory bank group and the second memory bank group under the control of said compare signal, and generate said refresh address signal CRA.

4. The refresh controller according to claim 3, wherein the first memory bank group and the second memory bank group searched out respectively by said first search module and second search module are the same when said last refresh signal last_ccr is in its second status.

5. The refresh controller according to claim 3, wherein the first search module is a forward search module, configured to search forwardly in said plurality of memory bank groups; the second search module is a backward search module, configured to search backwardly in said plurality of memory bank groups.

6. The refresh controller according to claim 3, wherein said multiplexer is configured to choose the address of the first memory bank group as said refresh address signal CRA when said compare signal is in its first status; and choose the address of the second memory bank group as said refresh address signal CRA when the compare signal is in its second status.

7. The refresh controller according to claim 1, wherein said scoreboard module comprises a plurality of counters, each of which corresponding to each group of said plurality of memory bank groups.

8. The refresh controller according to claim 7, wherein said scoreboard module is configured to set the counter corresponding to the memory bank group indicated by said external access signal or said refresh address signal CRA as in its second status.

9. The refresh controller according to claim 1, wherein said confliction detecting module is configured to generate confliction signal when said last refresh signal last_ccr is in its second status and the memory bank indicated by the external access signal belongs to the memory bank group indicated by said refresh address signal CRA.

10. The refresh controller according to claim 9, wherein said confliction detecting module is configured to generate confliction signal when the memory bank indicated by the external access signal is in its second status.

11. The refresh controller according to claim 1, wherein each of said plurality of memory bank groups contains 1, 2 or 4 memory banks.

12. A refresh controlling method for embedded DRAM, said embedded DRAM comprising a plurality of memory bank groups, said method comprising:
receiving an external access signal;
generating a refresh enabling signal REFN and a last refresh signal last_ccr according to the clock cycles in each refresh interval;
searching in said plurality of memory bank groups for at least one memory bank group to be refreshed in the refresh interval, and generate the a refresh address signal CRA according to the external access signal and the searched memory bank group;
recording the status of each of said plurality of memory bank groups according to said refresh address signal CRA and external access signal;
generating a confliction signal according to said external access signal, last refresh signal last_ccr and the status of each of said memory banks; and
transmitting the refresh enabling signal REFN and refresh address signal CRA to said embedded DRAM.

13. The refresh controlling method according to claim 12, wherein the step of generating refresh enabling signal REFN and last refresh signal last_ccr comprises:
counting the clock cycles in each refresh interval, and, setting said refresh enabling signal REFN as in its first status and setting said last refresh signal last_ccr as in its first status when the counted number is smaller than the number of said memory bank groups minus one; setting said refresh enabling signal REFN as in its first status and setting said last refresh signal last_ccr as in its second status when the counted number is equal to the number of said memory bank groups minus one; and setting said refresh enabling signal REFN as in its second status and setting said last refresh signal last_ccr as in its first status when the counted number is equal to or larger than the number of said memory bank groups.

14. The refresh controlling method according to claim 12, wherein the step of searching the memory bank groups and generating the refresh address signal CRA comprises:
searching in said plurality of memory bank groups for the first memory bank group and the second memory bank group to be refreshed in the refresh interval;
comparing the searched first memory bank group with the external access signal and generate the compare signal; and
choosing between the first memory bank group and the second memory bank group under the control of said compare signal, and generating said refresh address signal CRA.

15. The refresh controlling method according to claim 14, wherein the first memory bank group and the second memory bank group searched out by said first search module and second search module are the same when said last refresh signal is in the second status.

16. The refresh controlling method according to claim 14, wherein the step of searching for the first memory bank group and the second memory bank group to be refreshed comprises: searching forwardly and backwardly in said plurality of memory bank groups respectively.

17. The refresh controlling method according to claim 14, wherein the step of choosing between the first memory bank group and the second memory bank group comprises: choosing the address of the first memory bank group as said refresh address signal CRA when said compare signal is in its first status; and choosing the address of the second memory bank group as said refresh address signal CRA when said compare signal is in its second status.

18. The refresh controlling method according to claim 12, wherein the step of recording the status of each of said plurality of memory bank groups comprises:
setting the scoreboard corresponding to the memory bank group indicated by the refresh address signal CRA or the external access signal as in its second status.

19. The refresh controlling method according to claim 12, wherein the step of generating the confliction signal comprises: generating the confliction signal when said last refresh signal last_ccr is in its second status and the target memory bank indicated by the external access signal belongs to the memory bank group indicated by said refresh address signal CRA.

20. The refresh controlling method according to claim 12, wherein the step of generating the confliction signal comprises: generating the confliction signal when the memory bank group indicated by the external access signal is in its second status.

* * * * *